(12) United States Patent
Duan et al.

(10) Patent No.: US 10,317,800 B2
(45) Date of Patent: Jun. 11, 2019

(54) MASKLESS PHOTOLITHOGRAPHIC SYSTEM IN COOPERATIVE WORKING MODE FOR CROSS-SCALE STRUCTURE

(71) Applicant: Technical Institute of Physics and Chemistry of the Chinese Academy of Sciences, Beijing (CN)

(72) Inventors: Xuanming Duan, Beijing (CN); Xianzi Dong, Beijing (CN); Meiling Zheng, Beijing (CN)

(73) Assignee: Technical Institute of Physics and Chemistry of the Chinese Academy of Sciences, Beijing (CN)

( * ) Notice: Subject to any disclaimer, the term of this patent is extended or adjusted under 35 U.S.C. 154(b) by 2 days.

(21) Appl. No.: 15/747,475

(22) PCT Filed: Jun. 28, 2016

(86) PCT No.: PCT/CN2016/087415
§ 371 (c)(1),
(2) Date: Jan. 25, 2018

(87) PCT Pub. No.: WO2017/016362
PCT Pub. Date: Feb. 2, 2017

(65) Prior Publication Data
US 2018/0217501 A1 Aug. 2, 2018

(30) Foreign Application Priority Data

Jul. 27, 2015 (CN) .......................... 2015 1 0446458

(51) Int. Cl.
*G03F 7/20* (2006.01)
*B23K 26/00* (2014.01)

(52) U.S. Cl.
CPC ............ *G03F 7/2053* (2013.01); *B23K 26/00* (2013.01); *G03F 7/2057* (2013.01);
(Continued)

(58) Field of Classification Search
CPC ............... G03F 7/2053; G03F 7/70508; G03F 7/70291; G03F 7/70383; G03F 7/7045;
(Continued)

(56) References Cited

U.S. PATENT DOCUMENTS

| 5,298,365 A | * | 3/1994 | Okamoto | .................. G03F 1/26 250/492.1 |
| 2013/0183833 A1 | * | 7/2013 | Duan | .................. B23K 26/0613 438/778 |

FOREIGN PATENT DOCUMENTS

| CN | 101216663 | 7/2008 |
| CN | 102000912 | 4/2011 |

OTHER PUBLICATIONS

Written Opinion and International Search Report for International application No. PCT/CN2016/087415, dated Aug. 29, 2016; 10 pages (English and Chinese).

* cited by examiner

*Primary Examiner* — Michael Maskell
(74) *Attorney, Agent, or Firm* — Rankin, Hill & Clark LLP

(57) ABSTRACT

A maskless photolithoghrapic system includes a laser point-by-point scanning exposure unit, a plane-projection exposure unit, a mobile station and a calculation control unit that decomposes a pattern to be exposed, so that a pattern portion with a precision requirement below a pre-determined threshold is exposed by the laser point-by-point scanning exposure unit, and a pattern portion with a precision requirement greater than the pre-determined threshold is exposed by the plane-projection exposure unit; when conducting laser point-by-point scanning exposure on a sample on the mobile station, the light emitted by the laser point-by-point scanning exposure unit moves relative to the sample according to the pattern portion with a precision requirement below the
(Continued)

pre-determined threshold; and when conducting plane-projection exposure on the sample, the plane-projection exposure unit emits light with a corresponding pattern shape onto the sample according to the graph with a precision requirement greater than the pre-determined threshold.

26 Claims, 4 Drawing Sheets

(52) U.S. Cl.
CPC ........ *G03F 7/70025* (2013.01); *G03F 7/7045* (2013.01); *G03F 7/7055* (2013.01); *G03F 7/70291* (2013.01); *G03F 7/70383* (2013.01); *G03F 7/70466* (2013.01); *G03F 7/70508* (2013.01)

(58) Field of Classification Search
CPC ............... G03F 7/70466; G03F 7/2057; G03F 7/70025; G03F 7/7055; B23K 26/00
USPC ......................................... 250/492.1–492.22
See application file for complete search history.

MASKLESS PHOTOLITHOGRAPHIC SYSTEM IN COOPERATIVE WORKING MODE FOR CROSS-SCALE STRUCTURE

TECHNICAL FIELD

The present invention relates to the technical field of photolithography, in particular to a maskless photolithographic system in cooperative working mode for cross-scale structures.

BACKGROUND OF THE INVENTION

For a practical micro-nano device, it not only needs manufacture of a high-precision micro-nanostructure with a key function but also manufacture of a large-area macro-structure capable of being connected with an external input/output signal. Co-existance of multi-scale structures cannot be avoided in a micro-nano device manufacturing process. For example, in a typical fin field effect transistor structure, the size of a source and a drain connected with an external electrode is about greater than 100 μm*100 μm, but the characteristic size of a fin structure connected between the source and the drain is about 20 nm*100 nm, i.e., a ratio of the large-area source and drain structures with a micron-scale precision to the fin structure with a nano-scale precision is 5000000:1. For another example, in a structure of a photonic crystaldemultiplexer, the area of a light incidence waveguide/emergence waveguide with a micron-scale precision is about 198000 μm$^2$, but the area of a high-precision structure with a nano-scale precision is 4500 μm$^2$, and a ratio of the incidence waveguide/emergence waveguide area to the area of the high-precision structure is 44:1.

At present, a micro-nano structure or device containing multi-scale structures is usually manufactured sequentially by adopting various methods in turn. For example, ultraviolet mask photolithography is adopted for manufacturing a large-area micro-scale-precision structure, and then photolithography such as electron beam photolithography is adopted for manufacturing a nano-scale structure. When exposure is performed sequentially by adopting these various methods, an alignment mark needs to be made on a substrate material, and an optical system needs be used for observing splicing in an overlay process of structures manufactured by adopting different methods. Further, the splicing precision is further restricted by imaging resolution of the observation system. Additionally, a masking plate needs be manufactured through electron beam photolithography point-by-point scanning for each designed structure. Hence the period of the device manufacturing process is long, the technology is complex and the cost is high. When a single high-precision processing technique (such as an electron beam point-by-point scanning) is used for manufacturing, the manufacturing time will be very long and the efficiency is lower.

Maskless photolithography techniques based on plane projection exposure of a spatial light modulator (such as DMD plane projection photolithography) are suitable for manufacturing a submicron-scale precision two-dimensional or three-dimensional large-area complex structure, and laser direct writing techniques (such as a femto-second laser two-photon fabrication technique) are suitable for fabricating small-area nano-scale two-dimensional or real three-dimensional structures. These two techniques both are realized by directly processing graphic data and controlling the movement of a mobile station or the deflection of a DMD micro-mirror through a computer according to a data document. Since these two methods both use photon beam processing and spatial environment requirements for realizing them are the same, the two methods can be integrated and used for realizing one-step formation of cross-scale complex structures. Up to now, there have been no systems or methods for realizing cross-scale structure processing by combining these two techniques.

SUMMARY OF THE INVENTION

The purpose of the present invention is to provide a maskless photolithographic system in cooperatively working mode for a cross-scale structure, comprising: a laser point-by-point scanning exposure unit, a plane projection exposure unit, a mobile station and a calculation and control unit, wherein the calculation and control unit decomposes a pattern to be exposed, such that the pattern portion with a required precision below a predetermined threshold is exposed by the laser point-by-point scanning exposure unit, and the pattern portion with a required precision above the predetermined threshold is exposed by the plane projection exposure unit; when laser point-by-point scanning exposure is performed to a sample on the mobile station, light emergent from the laser point-by-point scanning exposure unit moves relative to the sample according to the pattern portion with the required precision below the predetermined threshold, so as to realize the laser point-by-point scanning exposure to the sample; and when plane projection exposure is performed to the sample, the plane projection exposure unit enables light with a shape corresponding to the pattern portion to become emergent onto the sample according to the pattern portion with the required precision above the predetermined threshold, so as to realize the plane projection exposure to the sample.

In one specific embodiment, the laser point-by-point scanning exposure unit comprises: a first light source, a first light beam expanding lens group, a first light transmission direction adjustment optical assembly and a first objective lens, wherein the first light source emits light used for laser point-by-point scanning; the first light beam expanding lens group expands the light emitted by the first light source to form parallel light; the first light transmission direction adjustment optical assembly guides the parallel light formed after light beam expansion performed by the first light beam expanding lens group into the first objective lens; and the first objective lens focuses the guided-in light onto the sample.

In one specific embodiment, the plane projection exposure unit comprises: a second light source, a second light beam expanding lens group, a spatial light modulation device, a second light transmission direction adjustment optical assembly and a second objective lens, wherein the second light source emits light used for plane projection exposure photolithography; the second light beam expanding lens group is used for expanding the light emitted by the second light source to form parallel light; according to the graph with the required precision above the predetermined threshold provided by the calculation and control unit, the spatial light modulation device modulates the parallel light formed after light beam expansion performed by the second light beam expanding lens group to form parallel light with the shape corresponding to the pattern portion and enables the parallel light to become emergent to the second light transmission direction adjustment optical assembly; the second light transmission direction adjustment optical assembly focuses the parallel light with the shape corresponding to the pattern portion onto a front focal plane of the second objective lens; and the second objective lens projects the parallel light onto the sample.

In one specific embodiment, the laser point-by-point scanning exposure unit comprises: a first light source, a first light beam expanding lens group, a first light transmission direction adjustment optical assembly and a first objective lens, wherein the first light source emits light used for laser point-by-point scanning; the first light beam expanding lens group expands the light emitted by the first light source to form parallel light; the first light transmission direction adjustment optical assembly guides the parallel light formed after light beam expansion performed by the first light beam expanding lens group into the first objective lens; and the first objective lens focuses the guided-in light onto the sample; and wherein the plane projection exposure unit comprises: a second light source, a second light beam expanding lens group, a spatial light modulation device, a second light transmission direction adjustment optical assembly and the first objective lens, wherein the second light source emits light used for plane projection exposure photolithography; the second light beam expanding lens group is used for expanding the light emitted by the second light source to form parallel light; according to the pattern portion with the required precision above the predetermined threshold provided by the calculation and control unit, the space light modulation device modulates the parallel light formed after light beam expansion performed by the second light beam expanding lens group to form parallel light with the shape corresponding to the pattern portion and enables the parallel light to become emergent to the second light transmission direction adjustment optical assembly; the second light transmission direction adjustment optical assembly focuses the parallel light with the shape corresponding to the pattern portion onto a front focal plane of the first objective lens; and the first objective lens projects the parallel light onto the sample.

In one specific embodiment, the laser point-by-point scanning exposure unit further comprises: a first light gate provided between the first light source and the first light beam expanding lens group and used for adjusting exposure time of the laser point-by-point scanning exposure unit under the control of the calculation and control unit.

In one specific embodiment, the first light gate is a first mechanical shutter or a first light modulator.

In one specific embodiment, the laser point-by-point scanning exposure unit further comprises: a first energy control assembly provided between the first light source and the first light gate and used for adjusting energy or power of the light emitted by the first light source.

In one specific embodiment, the first energy control assembly is a light absorbing type optical attenuator, a polarizer, a half-wave plate or an acousto-optic modulator.

In one specific embodiment, the first light transmission direction adjustment optical assembly comprises: a first reflective mirror and a first dichroscope, wherein the parallel light formed after light beam expansion performed by the first light beam expanding lens group is guided into the first objective lens sequentially through the first reflective mirror and the first dichroscope.

In one specific embodiment, the laser point-by-point scanning exposure unit further comprises: a two-dimensional galvanometer provided between the first reflective mirror and the first dichroscope.

In one specific embodiment, the first light source is a continuous laser light source or a pulse laser light source with a wavelength adjustment range of 157 nm-1064 nm and a polarization state being linear polarization, circular polarization or elliptical polarization; and wherein the frequency of the pulse laser light source is 1 Hz-100 MHz.

In one specific embodiment, magnification of the first objective lens is 1-200 and a numerical aperture is 0.001-1.8.

In one specific embodiment, the plane projection exposure unit further comprises: a second light gate provided between the second light source and the second light beam expanding lens group and used for adjusting exposure time of the plane projection exposure unit under the control of the calculation and control unit.

In one specific embodiment, the second light gate is a second mechanical shutter or a second light modulator.

In one specific embodiment, the plane projection exposure unit further comprises: a second energy control assembly provided between the second light source and the second light gate and used for adjusting energy or power of the light emitted by the second light source.

In one specific embodiment, the second energy control assembly is a light absorbing type optical attenuator, a polarizer, a half-wave plate or an acousto-optic modulator.

In one specific embodiment, the second light transmission direction adjustment optical assembly comprises: a second lens and a second dichroscope, wherein the parallel light with the shape corresponding to the pattern portion is focused onto the front focal plane of the second objective lens sequentially through the second lens and the second dichroscope.

In one specific embodiment, the second light transmission direction adjustment optical assembly comprises: a second lens, a second dichroscope and the first dichroscope, wherein the parallel light with the shape corresponding to the pattern portion is focused onto the front focal plane of the first objective lens sequentially through the second lens, the second dichroscope and the first dichroscope.

In one specific embodiment, the plane projection exposure unit further comprises a light beam homogenizing assembly which homogenizes the parallel light formed after light beam expansion performed by the second light beam expanding lens group.

In one specific embodiment, the plane projection exposure unit further comprises a diaphragm used for restricting emergence area of the homogenized light.

In one specific embodiment, the plane projection exposure unit further comprises a second reflective mirror and a third reflective mirror, wherein the light emergent from the diaphragm is guided into the spatial light modulation device sequentially through the second reflective mirror and the third reflective mirror.

In one specific embodiment, the second light source is selected from the group consisting of: a continuous laser light source or a pulse laser light source with a wavelength adjustment range of 157 nm-1064 nm and a polarization state being linear polarization, circular polarization or elliptical polarization, wherein the frequency of the pulse laser light source is 1 Hz-100 MHz; or a mercury lamp, a xenon lamp, a bromine-tungsten lamp or an LED lamp with a wavelength range of 157 nm-1064 nm.

In one specific embodiment, magnification of the second objective lens is 1-200 and a numerical aperture is 0.001-1.8.

In one specific embodiment, the space light modulation device is a spatial light modulator used for performing light amplitude modulation to the light, a spatial light modulator used for performing light phase modulation to the light or a spatial light modulator used for performing polarization modulation to the light.

In one specific embodiment, the mobile station is selected from the group consisting of: a three-dimensional mobile station consisting of three independent linearly-moving mobile stations; a three-dimensional mobile station consisting of a two-dimensional parallel-connection mobile station and one independent mobile station; a three-dimensional parallel-connection mobile station; or a multidimensional mobile station consisting of mobile stations with rotating and tilting functions, wherein a movement range is 0.1 μm-1 m, a rotation angle is 0-360° and a tilt angle is −90°-+90°.

In one specific embodiment, the calculation and control unit comprises: a data reading part used for reading the pattern to be exposed; a data processing part used for decomposing the pattern to be exposed and a control part used for controlling the mobile station, the laser point-by-point scanning exposure unit and the plane projection exposure unit to work cooperatively.

THE PRESENT INVENTION HAS THE FOLLOWING BENEFICIAL EFFECTS

The system and method provided by the present invention integrate the plane projection maskless exposure technique and the laser point-by-point photolithography, and realize the exposure of pattern with multi-scale structures on photosensitive materials in one photolithography execution process, which not only contain micron-scale-precision large-area structures, but also contain nano-scale-precision structures.

The cross-scale structures manufactured by adopting the method provided by the present invention does not need be secondarily aligned and spliced, and all model data have already been decomposed by a calculation and control unit before exposure.

The method provided by the present invention can realize processing of two-dimensional and three-dimensional complex structures.

REFERENCE NUMERALS

1—first light source; 2—first energy control assembly; 3—first light gate; 4—first light beam expanding lens group; 5—first reflective mirror; 6—first dichroscope; 7—second light source; 8—second energy control assembly; 9—second light gate; 10—second light beam expanding lens group; 11—light beam homogenizing assembly; 12—diaphragm; 12—second reflective mirror; 14—third reflective mirror; 15—spatial light modulator; 16—second lens; 17—second dichroscope; 18—first objective lens; 19—mobile station; 20—calculation and control unit; 21—second objective lens

DETAILED DESCRIPTION

The present invention will be described with reference to the drawings in combination with the preferred embodiments of the present invention. It shall be understood that many specific details such as description about optical components are provided in the description below to facilitate the comprehensive understanding about the embodiments of the present invention. However, one skilled in the art shall understand that the present invention not only is suitable for one or more specific descriptions, but also is suitable for other structural elements, wavelengths, materials, etc. The embodiments listed below in the description are exemplary instead of restrictive.

Figure 1:
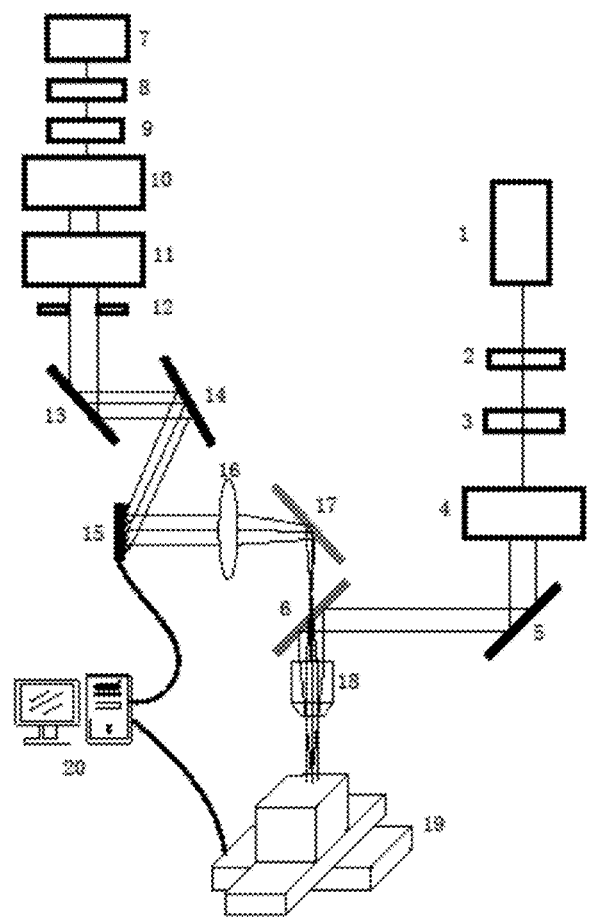
FIG. 1 illustrates a schematic diagram of a maskless photolithographic system in cooperatively working mode for a cross-scale structure according to one embodiment of the present invention.

FIG. 1 illustrates a schematic diagram of a maskless photolithographic system in cooperatively working mode for a cross-scale structure according to one embodiment of the present invention. The photolithographic system comprises a laser point-by-point scanning exposure unit, a plane projection exposure unit, a mobile station 19 and a calculation and control unit 20.

Figure 3:
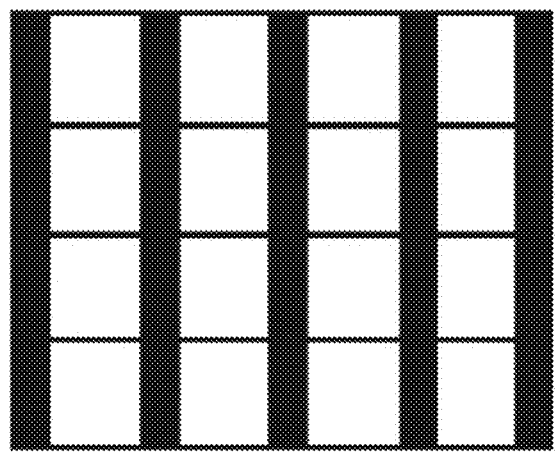
FIG. 3 illustrates a pattern to be exposed with not only a micron-scale precision pattern portion but also a nano-scale precision portion.

A graph document having a pattern to be exposed (as illustrated in FIG. 3) are input into the calculation and control unit 20 and the pattern is decomposed such that the pattern portion with a required precision below a predetermined threshold is exposed by the laser point-by-point scanning exposure unit, and the pattern portion with a required precision above the predetermined threshold is exposed by the plane projection exposure unit.

Figure 4:
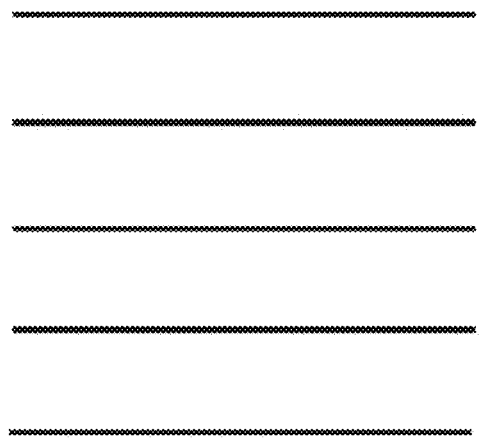
FIG. 4 illustrates a pattern portion with a precision smaller than or equal to 1 micron after the pattern of FIG. 3 is decomposed.
Figure 5:
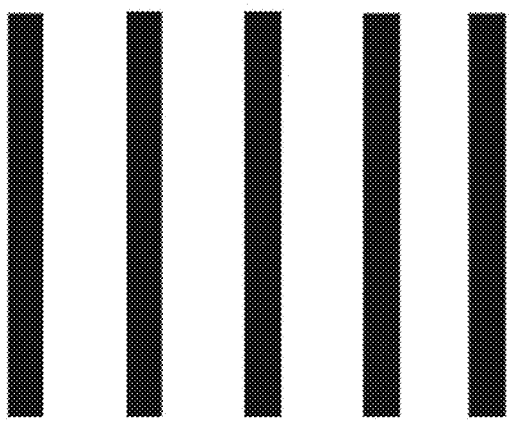
FIG. 5 illustrates a pattern portion with a precision greater than 1 micron after the pattern of FIG. 3 is decomposed.

The predetermined threshold can be determined by one skilled in the art according to an actual situation. For example, in one specific example, a pattern portion with the required precision below 1 μm (e.g., a portion illustrated in FIG. 4 after FIG. 3 is decomposed) is allocated to the laser point-by-point scanning exposure unit, and the calculation and control unit 20 controls the mobile station 19 to move according to data of this portion. A pattern portion with a required precision above 1 μm (e.g., a portion illustrated in FIG. 5 after FIG. 3 is decomposed) is allocated to the plane projection exposure unit. It can be freely selected to allocate a pattern portion with a required precision of 1 μm to the laser point-by-point scanning exposure unit or the plane projection exposure unit.

When laser point-by-point scanning exposure is performed to a sample on the mobile station, light emergent from the laser point-by-point scanning exposure unit moves relative to the sample according to the pattern with the required precision below the predetermined threshold, so as to realize the laser point-by-point scanning exposure to the sample. In one specific example of forming a three-dimensional pattern on the sample, during point-by-point scanning exposure, the point-by-point scanning exposure unit does not move, and the mobile station moves in three dimensions according to the pattern with the required precision below the predetermined threshold, such that the light emergent from the scanning exposure unit cooperates with the three-dimensional movement of the mobile station to enable the emergent light to move relative to the mobile station to realize the three-dimensional pattern. In another specific example of forming a three-dimensional pattern on the sample, the laser point-by-point scanning exposure unit can be provided with a two-dimensional galvanometer, and by using the two-dimensional galvanometer, the mobile station can achieve the purpose of realizing the three-dimensional graph through one-dimensional movement only. In one specific example of forming a two-dimensional pattern on the sample, the laser point-by-point scanning exposure unit can be provided with a two-dimensional galvanometer, and by using the two-dimensional galvanometer, the mobile station can achieve the purpose of realizing the two-dimensional pattern without moving. The use of the two-dimensional galvanometer is well known by one skilled in the art and will be further described through a specific example below.

When plane projection exposure is performed to the sample, the plane projection exposure unit enables light with a shape corresponding to the pattern portion to become emergent onto the sample according to the pattern portion with the required precision above the predetermined threshold, so as to realize the plane projection exposure to the sample.

The laser point-by-point scanning exposure unit may comprise: a first light source 1, a first energy control assembly 2, a first light gate 3, a first light beam expanding lens group 4, a first reflective mirror 5 and a first dichroscope 6.

The plane projection exposure unit may comprise: a second light source 7, a second energy control assembly 8, a second light gate 9, a second light beam expanding lens group 10, a light beam homogenizing assembly 11, a diaphragm 12, a second reflective mirror 13, a third reflective mirror 14, a spatial light modulator 15, a second lens 16 and a second dichroscope 17.

In the laser point-by-point scanning exposure unit, the light emitted by the first light source 1 is expanded by the first light beam expanding lens group 4, then reflected by the first reflective mirror 5 and the first dichroscope 6, then incident into the first objective lens 18 in the form of parallel light and finally is focused onto the surface of the sample carried by the mobile station 19.

Preferably, the first light source 1 is a continuous laser light source or a pulse laser light source. More preferably, a wavelength adjustment range is 157 nm-1064 nm; more preferably, a polarization state of the light source is linear polarization, circular polarization or elliptical polarization; and more preferably, the frequency of the pulse laser light source is 1 Hz-100 MHz.

Preferably, the first light beam expanding lens group 4 may be realized through combination of lenses, such as combination of two convex lenses or combination of one concave lens and one convex lens. Light beam expanding magnification of the first light beam expanding lens group 4 may be within a range of 0.1-100.

Preferably, the first objective lens 18 is a dry objective lens, a water immersion objective lens or an oil immersion objective lens. Still preferably, a numerical aperture is 0.001-1.8 and magnification is 1-200.

Preferably, the laser point-by-point scanning exposure unit further comprises: a first light gate 3 provided between the first light source 1 and the first light beam expanding lens group 4 and used for adjusting exposure time of the laser point-by-point scanning exposure unit under the control of the calculation and control unit 20. More preferably, the first light gate is a mechanical shutter or a light modulator.

Preferably, the laser point-by-point scanning exposure unit further comprises: a first energy control assembly 2 provided between the first light source and the first light gate and used for adjusting energy or power of the light emitted by the first light source. More preferably, the first energy control assembly 2 is a light absorbing type optical attenuator, a polarizer, a half-wave plate or an acousto-optic modulator.

Preferably, the laser point-by-point scanning exposure unit further comprises: a two-dimensional galvanometer provided between the first reflective mirror and the first dichroscope. With the two-dimensional galvanometer, the mobile station can achieve the purpose of point-by-point scanning exposure through one-dimensional movement only, and the working efficiency is improved. In the plane projection exposure unit, the light emitted by the second light source 7 sequentially passes through the second light beam expanding lens group 10, becomes incident onto the spatial light modulator 15 and passes through the spatial light modulator 15, and the emergent light has a plane pattern corresponding to the pattern portion with the required precision greater than the predetermined threshold; the light beam then passes through the second lens 16, the second dichroscope 17 and the first dichroscope 6 and then enters into the first objective lens 18, wherein after the light beam passes through the lens 16, each light beam and the entire plane light source converge at a front focal plane of the objective lens, and each light beam and the entire plane light source, after passing through the first objective lens 18, become parallel light which is projected onto the surface of the sample carried by the three-dimensional mobile station; and the calculation and control unit controls the change of the spatial light modulator 15 and the movement of the mobile station 19 to realize the cooperative operation of the two scanning units.

Preferably, the second light source 7 is a continuous laser light source or a pulse laser light source; more preferably, a wavelength adjustment range is 157 nm-1064 nm; a polarization state may be linear polarization, circular polarization or elliptical polarization; the frequency of the pulse laser light source is 1 Hz-100 MHz; alternatively, the second light source 7 is a mercury lamp, a xenon lamp, a bromine-tungsten lamp or an LED lamp; and more preferably, a wavelength range is 157 nm-1064 nm.

Preferably, the second light beam expanding lens group 10 may be realized through combination of lenses, such as combination of two convex lenses or combination of one concave lens and one convex lens. Light beam expanding magnification of the second light beam expanding lens group 10 may be within a range of 0.1-100.

Preferably, the spatial light modulation device 15 is a spatial light modulator for performing light amplitude modulation to the light, a spatial light modulator for performing light phase modulation to the light or a spatial light modulator for performing polarization modulation to the light.

Preferably, the focal length of the second lens 16 is within a range of 1 mm-500 mm.

Preferably, the plane projection exposure unit further comprises: a second light gate 9 provided between the second light source 7 and the second light beam expanding lens group 10 and used for adjusting exposure time of the plane projection exposure unit under the control of the calculation and control unit 20. More preferably, the second light gate 9 is a mechanical shutter or a light modulator.

Preferably, the plane projection exposure unit further comprises: a second energy control assembly 8 provided between the second light source 7 and the second light gate 9 and used for adjusting energy or power of the light emitted by the second light source 7. More preferably, the second energy control assembly 8 is a light absorbing type optical attenuator, a polarizer, a half-wave plate or an acousto-optic modulator.

Preferably, the plane projection exposure unit further comprises a light beam homogenizing assembly 11 and the light beam homogenizing assembly 11 homogenizes the parallel light formed after light beam expansion performed by the second light beam expanding lens group 10.

When the second light source 7 is laser, the light beam homogenizing assembly 11 may be realized through combination of lenses capable of changing laser to flattened light, such as combination of Kepler or Galileo lenses; and when the second light source 7 is a lamp source such as a mercury lamp, the light beam homogenizing assembly 11 may be realized through a fly lens group, etc.

Preferably, the plane projection exposure unit further comprises a diaphragm 12 for restricting emergence area of the homogenized light.

Preferably, the plane projection exposure unit further comprises a second reflective mirror 13 and a third reflective mirror 14, wherein the light emergent from the diaphragm 12 is guided into the spatial light modulation device 15 sequentially through the second reflective mirror 13 and the third reflective mirror 14.

In one specific example, the calculation and control unit 20 comprises: a data reading part for reading the pattern to be exposed; a data processing part for decomposing the pattern to be exposed; and a control part for controlling the mobile station, the laser point-by-point scanning exposure unit and the plane projection exposure unit to work cooperatively.

In one specific example, the mobile station 19 is selected from the following group consisting of a three-dimensional mobile station consisting of three independent linearly-moving mobile stations; a three-dimensional mobile station consisting of a two-dimensional parallel-connection mobile station and one independent mobile station; a three-dimensional parallel-connection mobile station; or a multidimensional mobile station consisting of mobile stations with rotating and tilting functions, wherein a movement range is preferably 1 nm-10000 mm and more preferably 0.1 μm-1 m, a rotation angle is 0-360° and a tilt angle is −90°-+90°.

Figure 2:
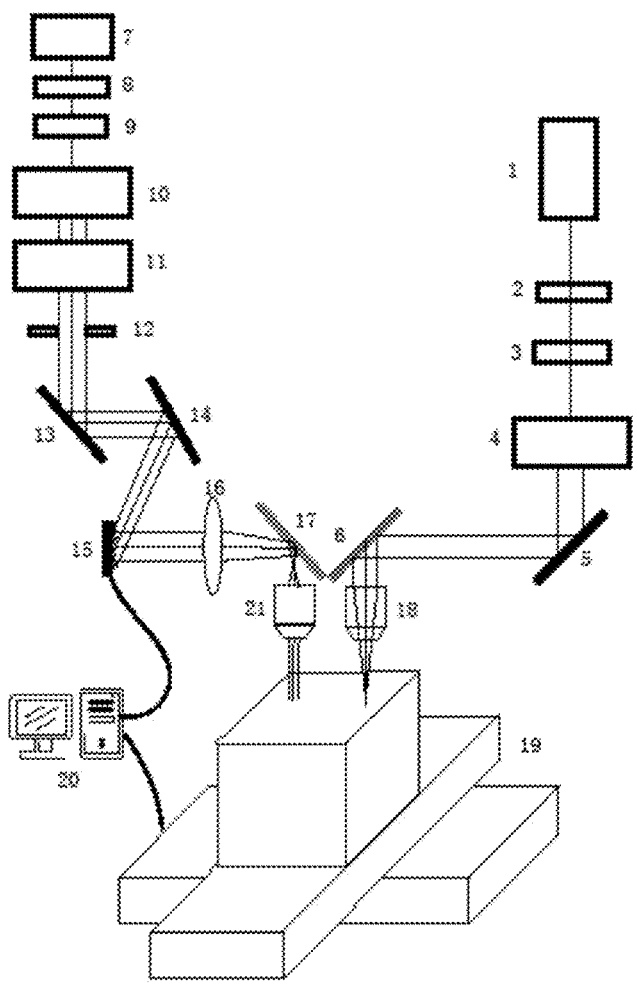
FIG. 2 illustrates a schematic diagram of a maskless photolithographic system in cooperatively working mode for a cross-scale structure according to another embodiment of the present invention.

FIG. 2 illustrates a schematic diagram of a maskless photolithographic system in cooperatively working mode for a cross-scale structure according to another embodiment of the present invention. In this system, except the laser point-by-point scanning exposure unit and the plane projection exposure unit respectively use respective objective lens 18 and objective lens 21, other structures in the system are the same as that in the system illustrated in FIG. 1.

The purpose of the maskless photolithographic system in cooperatively working mode for a cross-scale structure provided by the present invention is to realize a method for exposing a cross-scale structure in one exposure process. Steps are as follows:

1) The first light source and the second light source are turned on.
2) The light emitted by the first light source, after beam expansion, being adjusted by the reflective mirror and the dichroscope, is focused onto the focal plane of the objective lens.
3) The light beam emitted by the second light source forms a plane pattern after being modulated by the spatial light modulator and further forms an image on the focal plane of the objective lens through an imaging lens consisting of the lens and the objective lens.
4) Calibrated is A displacement difference between coordinates of a central point of plane projection exposure and coordinates of a focal point of laser point-by-point scanning.
5) The graph document (as illustrated in FIG. 3) is input and pattern data are decomposed. The pattern portion with the required precision below the predetermined threshold (such as the portion illustrated in FIG. 4 after FIG. 3 is decomposed) is allocated to the laser point-by-point scanning exposure unit, and the calculation and control unit controls the mobile station to move according to data of this portion. The pattern portion with the required precision above 1 μm (e.g., the portion illustrated in FIG. 5 after FIG. 3 is decomposed) is allocated to the plane projection exposure unit, and the calculation and control unit allocates pattern data of this portion to the spatial light modulator to enable a plane light source to emit light corresponding to the model data.
6) Plane projection exposure and laser point-by-point scanning exposure are sequentially performed, and when switching from each other, the mobile station is moved for the displacement difference in step 4) so as to accurately splice the two exposed patterns. The deflection between the coordinates of the central point of plane projection exposure and the coordinates of the focal point of laser point-by-point exposure in the two exposed patterns caused by the optical structures is compensated by moving the mobile station for fixed displacement.
7) The photosensitive material is disposed on the sample table of the mobile station controlled by the calculation and control unit, and the exposure time is controlled through the light gates, and the transmissivity of the laser energy or the plane projection exposure energy is controlled through the energy control assemblies.
8) A structure is obtained through post-processing processes: the photosensitive material obtained in step 6) under the cooperative working of laser point-by-point scanning and plane projection exposure is subjected to processes such as washing, heating decomposition, ablation, etching and development, and corresponding process conditions are selected according to the type of the material; and the portion of the photosensitive material which does not interact with light is removed to obtain a negative structure, or the portion of the photosensitive material which interacts with light is removed to obtain a positive structure.

In the above-mentioned technical solution, the photosensitive material may be an organic photosensitive material, an inorganic photosensitive material or a photosensitive material containing metal ions.

The present invention will be described below in detail in combination with specific examples. The purposes and effects of the present invention will become more obvious.

Embodiment 1: Two-Dimensional Structure Realized Through Plane Projection Exposure A 370 nm femto-second titanium sapphire light source was used as a plane projection exposure light source, with the pulse width being 100 fs, the pulse repetition frequency being 82 MHz, the diameter of alight beam being 2 mm. The laser light was expanded by a light beam expanding lens group to form a parallel light beam with diameter of 50 mm.

Figure 6:
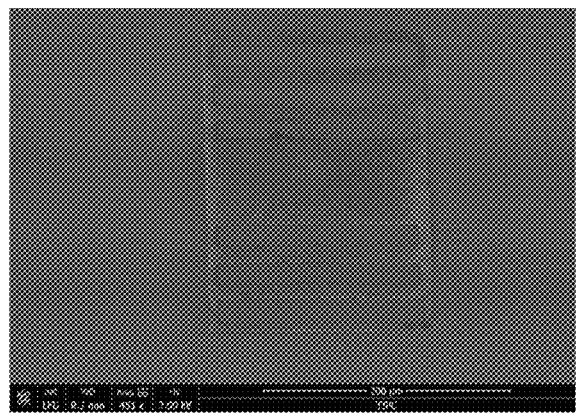
FIG. 6 illustrates a scanning optical microscope photograph of a structure formed through exposure by using a plane projection exposure method.

A rectangular uniform light spot in a central range of 10 mm*14 mm was obtained through a light beam interception method and became incident onto a DMD surface from an angle of 24°. Then, the light beam reflected by the DMD surface was finally projected onto a surface of a photosensitive material (I-PL) through a convex lens with focal length of 250 mm and a 50× objective lens (with a numerical aperture of 0.8). A light gate controls the exposure time to be 300 ms. Finally, a pattern realized through plane projection exposure was as illustrated in FIG. 6, and a plane projection exposure range was 179 µm*237.9 µm.

Figure 7:
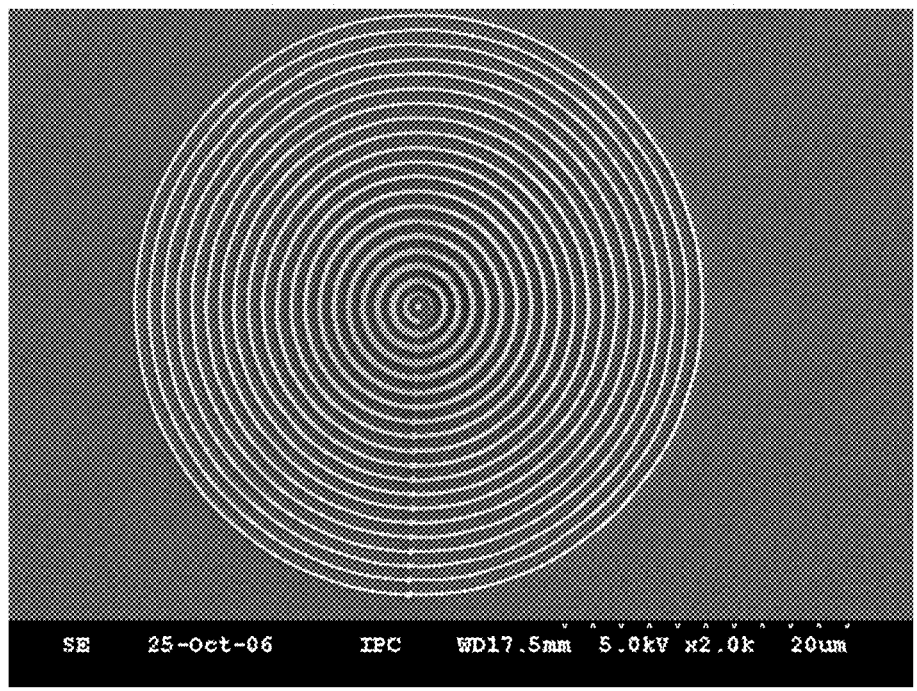
FIG. 7 illustrates a scanning electron microscope photograph of a structure formed through exposure by using a laser point-by-point scanning method.

Embodiment 2: Two-Dimensional Structure Realized Through Laser Point-By-Point Scanning Exposure A 800 nm femto-second titanium sapphire light source was used as a laser point-by-point scanning exposure light source, with the pulse width being 100 fs, the pulse repetition frequency being 82 MHz, the diameter of alight beam being 1.8 mm. The laser light was expanded through a light beam expanding lens group to form a parallel light beam with diameter of 10 mm. The parallel light beam was focused onto a surface of a photosensitive material (SCR500) through an objective lens wherein the objective lens was an oil immersion objective lens with a numerical aperture 1.4 and magnification of 100. Concentric circles obtained through the point-by-point scanning method were as illustrated in FIG. 7, and the processing resolution was 120 nm.

Figure 8:
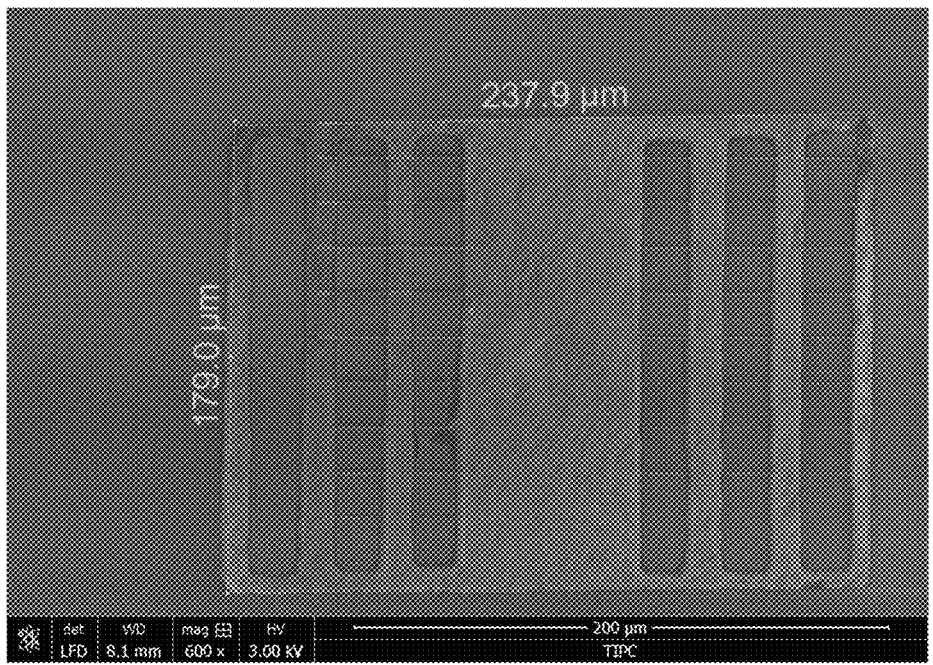
FIG. 8 illustrates a scanning electron microscope photograph of a structure formed through exposure by cooperatively using a plane projection exposure method and a laser point-by-point scanning method.

Embodiment 3: Cross-Scale Two-Dimensional Structure Manufactured Through Plane Projection and Laser Point-by-Point Scanning Cooperative Exposure A 370 nm femto-second titanium sapphire light source was used as a plane projection exposure light source, with the pulse width being 100 fs, the pulse repetition frequency being 82 MHz, the diameter of alight beam being 2 mm. The laser light was expanded by a light beam expanding lens group to form a parallel light beam with diameter of 50 mm. A rectangular uniform light spot in a central range of 10 mm*14 mm was obtained through a light beam interception method and became incident onto a DMD surface from an angle of 24°. Then, the light beam reflected by the DMD surface was finally projected onto a surface of a photosensitive material (I-PL) through a convex lens with focal length of 250 mm and an objective lens. A light gate controls the exposure time to be 300 ms. Simultaneously, a 740 nm femto-second titanium sapphire light source was used as a laser point-by-point scanning exposure light source, with the pulse width being 100 fs, the pulse repetition frequency being 82 MHz, the diameter of alight beam being 1.8 mm. The laser light was expanded through a light beam expanding lens group to form a parallel light beam with diameter of 10 mm. The parallel light beam was focused onto a surface of a photosensitive material (I-PL) through an objective lens. In this example, plane projection exposure and laser point-by-point scanning exposure shared the same objective lens with a numerical aperture of the objective lens being 0.8. The objective lens was a dry objective lens with magnification of 50 (namely, 50×). The structure realized through cooperative exposure was as illustrated in FIG. 8, and a plane projection exposure range was 179 µm*237.9 µm.

Although the present invention is described herein the context of a limited number of embodiments, the present invention may be implemented in various modes without going beyond the spirit of the basic features of the present invention. Therefore, in general, the described embodiments will be considered for the purpose of description instead of limitation. Therefore, the annexed claims express the scope of the present invention not merely through the above-mentioned description, and it is hereby expected that all variations are included in the equivalent meaning and scope of the claims.

The invention claimed is:

1. A maskless photolithographic system in cooperative working mode for cross-scale structures, comprising:
a laser point-by-point scanning exposure unit, a plane projection exposure unit, a mobile station and a calculation and control unit,
wherein the calculation and control unit decomposes a pattern to be exposed, such that a pattern portion with a required precision below a predetermined threshold is exposed by the laser point-by-point scanning exposure unit, and the pattern portion with a required precision above the predetermined threshold is exposed by the plane projection exposure unit;
when laser point-by-point scanning exposure is performed to a sample on the mobile station, light emergent from the laser point-by-point scanning exposure unit moves relative to the sample according to the pattern portion with the required precision below the predetermined threshold, so as to realize the laser point-by-point scanning exposure to the sample; and
when plane projection exposure is performed to the sample, the plane projection exposure unit enables light with a shape corresponding to the pattern portion to become emergent onto the sample according to the pattern portion with the required precision above the predetermined threshold, so as to realize the plane projection exposure to the sample.

2. The photolithographic system according to claim 1, wherein the laser point-by-point scanning exposure unit comprises:
a first light source, a first light beam expanding lens group, a first light transmission direction adjustment optical assembly and a first objective lens,
wherein the first light source emits light used for laser point-by-point scanning;
the first light beam expanding lens group expands the light emitted by the first light source to form parallel light;
the first light transmission direction adjustment optical assembly guides the parallel light formed after light beam expansion performed by the first light beam expanding lens group into the first objective lens; and
the first objective lens focuses the guided-in light onto the sample.

3. The photolithographic system according to claim 1, wherein the plane projection exposure unit comprises:
a second light source, a second light beam expanding lens group, a spatial light modulation device, a second light transmission direction adjustment optical assembly and a second objective lens,
wherein the second light source emits light used for plane projection exposure photolithography;
the second light beam expanding lens group is used for expanding the light emitted by the second light source to form parallel light;

according to the pattern portion with the required precision above the predetermined threshold provided by the calculation and control unit, the spatial light modulation device modulates the parallel light formed after light beam expansion performed by the second light beam expanding lens group to form parallel light with the shape corresponding to the pattern portion and enables the parallel light to become emergent to the second light transmission direction adjustment optical assembly;

the second light transmission direction adjustment optical assembly focuses the parallel light with the shape corresponding to the pattern portion onto a front focal plane of the second objective lens; and the second objective lens projects the parallel light onto the sample.

4. The photolithographic system according to claim 1, wherein the laser point-by-point scanning exposure unit comprises:

a first light source, a first light beam expanding lens group, a first light transmission direction adjustment optical assembly and a first objective lens, wherein the first light source emits light used for laser point-by-point scanning;

the first light beam expanding lens group expands the light emitted by the first light source to form parallel light;

the first light transmission direction adjustment optical assembly guides the parallel light formed after light beam expansion performed by the first light beam expanding lens group into the first objective lens; and the first objective lens focuses the guided-in light onto the sample; and wherein the plane projection exposure unit comprises:

a second light source, a second light beam expanding lens group, a spatial light modulation device, a second light transmission direction adjustment optical assembly and the first objective lens, wherein the second light source emits light used for plane projection exposure photolithography;

the second light beam expanding lens group is used for expanding the light emitted by the second light source to form parallel light;

according to the pattern portion with the required precision above the predetermined threshold provided by the calculation and control unit, the space light modulation device modulates the parallel light formed after light beam expansion performed by the second light beam expanding lens group to form parallel light with the shape corresponding to the pattern portion and enables the parallel light to become emergent to the second light transmission direction adjustment optical assembly;

the second light transmission direction adjustment optical assembly focuses the parallel light with the shape corresponding to the pattern portion onto a front focal plane of the first objective lens; and the first objective lens projects the parallel light onto the sample.

5. The photolithographic system according to claim 2, wherein the laser point-by-point scanning exposure unit further comprises:

a first light gate provided between the first light source and the first light beam expanding lens group and used for adjusting exposure time of the laser point-by-point scanning exposure unit under the control of the calculation and control unit.

6. The photolithographic system according to claim 5, wherein the first light gate is a first mechanical shutter or a first light modulator.

7. The photolithographic system according to claim 5, wherein the laser point-by-point scanning exposure unit further comprises:

a first energy control assembly provided between the first light source and the first light gate and used for adjusting energy or power of the light emitted by the first light source.

8. The photolithographic system according to claim 7, wherein the first energy control assembly is a light absorbing type optical attenuator, a polarizer, a half-wave plate or an acousto-optic modulator.

9. The photolithographic system according to claim 2, wherein the first light transmission direction adjustment optical assembly comprises: a first reflective mirror and a first dichroscope, wherein the parallel light formed after light beam expansion performed by the first light beam expanding lens group is guided into the first objective lens sequentially through the first reflective mirror and the first dichroscope.

10. The photolithographic system according to claim 9, wherein the laser point-by-point scanning exposure unit further comprises: a two-dimensional galvanometer provided between the first reflective mirror and the first dichroscope.

11. The photolithographic system according to claim 2, wherein the first light source is a continuous laser light source or a pulse laser light source with a wavelength adjustment range of 157 nm-1064 nm and a polarization state being linear polarization, circular polarization or elliptical polarization; and wherein the frequency of the pulse laser light source is 1 Hz-100 MHz.

12. The photolithographic system according to claim 2, wherein magnification of the first objective lens is 1-200 and a numerical aperture is 0.001-1.8.

13. The photolithographic system according to claim 3, wherein the plane projection exposure unit further comprises:

a second light gate provided between the second light source and the second light beam expanding lens group and used for adjusting exposure time of the plane projection exposure unit under the control of the calculation and control unit.

14. The photolithographic system according to claim 13, wherein the second light gate is a second mechanical shutter or a second light modulator.

15. The photolithographic system according to claim 13, wherein the plane projection exposure unit further comprises:

a second energy control assembly provided between the second light source and the second light gate and used for adjusting energy or power of the light emitted by the second light source.

16. The photolithographic system according to claim 15, wherein the second energy control assembly is a light absorbing type optical attenuator, a polarizer, a half-wave plate or an acousto-optic modulator.

17. The photolithographic system according to claim 3, wherein the second light transmission direction adjustment optical assembly comprises: a second lens (16) and a second dichroscope, wherein the parallel light with the shape corresponding to the pattern portion is focused onto the front focal plane of the second objective lens sequentially through the second lens and the second dichroscope.

18. The photolithographic system according to claim 4, wherein the second light transmission direction adjustment optical assembly comprises: a second lens, a second dichroscope and the first dichroscope, wherein the parallel light with the shape corresponding to the pattern portion is focused onto the front focal plane of the first objective lens sequentially through the second lens, the second dichroscope and the first dichroscope.

19. The photolithographic system according to claim 3, wherein the plane projection exposure unit further comprises a light beam homogenizing assembly which homogenizes the parallel light formed after light beam expansion performed by the second light beam expanding lens group.

20. The photolithographic system according to claim 19, wherein the plane projection exposure unit further comprises a diaphragm used for restricting emergence area of the homogenized light.

21. The photolithographic system according to claim 20, wherein the plane projection exposure unit further comprises a second reflective mirror and a third reflective mirror, wherein the light emergent from the diaphragm is guided into the spatial light modulation device sequentially through the second reflective mirror and the third reflective mirror.

22. The photolithographic system according to claim 3, wherein the second light source is selected from the group consisting of:
   a continuous laser light source or a pulse laser light source with a wavelength adjustment range of 157 nm-1064 nm and a polarization state being linear polarization, circular polarization or elliptical polarization, wherein the frequency of the pulse laser light source is 1 Hz-100 MHz; or
   a mercury lamp, a xenon lamp, a bromine-tungsten lamp or an LED lamp with a wavelength range of 157 nm-1064 nm.

23. The photolithographic system according to claim 3, wherein magnification of the second objective lens is 1-200 and a numerical aperture is 0.001-1.8.

24. The photolithographic system according to claim 3, wherein the spatial light modulation device is a spatial light modulator used for performing light amplitude modulation to the light, a spatial light modulator used for performing light phase modulation to the light or a spatial light modulator used for performing polarization modulation to the light.

25. The photolithographic system according to claim 1, wherein the mobile station is selected from the group consisting of:
   a three-dimensional mobile station consisting of three independent linearly-moving mobile stations;
   a three-dimensional mobile station consisting of a two-dimensional parallel-connection mobile station and one independent mobile station;
   a three-dimensional parallel-connection mobile station; or
   a multidimensional mobile station consisting of mobile stations with rotating and tilting functions,
   wherein a movement range is 0.1 μm-1 m, a rotation angle is 0-360° and a tilt angle is −90°-+90°.

26. The photolithographic system according to claim 1, wherein the calculation and control unit comprises:
   a data reading part used for reading the pattern to be exposed;
   a data processing part used for decomposing the pattern to be exposed; and
   a control part used for controlling the mobile station, the laser point-by-point scanning exposure unit and the plane projection exposure unit to work cooperatively.

* * * * *